(12) United States Patent
Chittipeddi et al.

(10) Patent No.: US 6,628,001 B1
(45) Date of Patent: Sep. 30, 2003

(54) INTEGRATED CIRCUIT DIE HAVING ALIGNMENT MARKS IN THE BOND PAD REGION AND METHOD OF MANUFACTURING SAME

(75) Inventors: Sailesh Chittipeddi, Allentown, PA (US); Keelathur N. Vasudevan, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/150,790

(22) Filed: May 17, 2002

(51) Int. Cl.⁷ ............................................. H01L 23/544
(52) U.S. Cl. ...................... 257/797; 257/786; 257/750; 438/401
(58) Field of Search .................. 257/797, 786, 257/750; 438/401, 622, 724

(56) References Cited

U.S. PATENT DOCUMENTS 5,946,559 A * 8/1999 Leedy ........................ 438/157
5,952,247 A * 9/1999 Livengood et al. .......... 438/734
6,265,119 B1 * 7/2001 Magome ....................... 430/30
6,294,909 B1 * 9/2001 Leedy .................... 324/207.17
6,303,459 B1 * 10/2001 Chen ........................... 438/401
6,413,863 B1 * 7/2002 Liu et al. ..................... 438/687
6,417,685 B1 * 7/2002 Akram et al. ................ 324/765
6,444,560 B1 * 9/2002 Pogge et al. ................. 438/612
6,465,898 B1 * 10/2002 Hnilo et al. .................. 257/797

FOREIGN PATENT DOCUMENTS

JP          1-281722     * 11/1989    ........... H01L/21/30

* cited by examiner

Primary Examiner—Jasmine J B Clark

(57) ABSTRACT

The present invention provides a die located on a semiconductor wafer. In one embodiment, the die includes a circuit region located within a circuit perimeter of the die. In addition, the die includes a bond pad region located between the circuit perimeter and an outer perimeter of the die. Also the die includes an alignment mark located within the bond pad region.

18 Claims, 2 Drawing Sheets

INTEGRATED CIRCUIT DIE HAVING ALIGNMENT MARKS IN THE BOND PAD REGION AND METHOD OF MANUFACTURING SAME

TECHNICAL FIELD OF THE INVENTION

The present invention is directed, in general, to integrated circuits and, more specifically, to an integrated circuit die having alignment marks in the bond pad regions and a method of manufacturing the same.

BACKGROUND OF THE INVENTION

It is well known that integrated circuit fabrication on semiconductor wafers requires the formation of precise electrical interconnections to create operative components in very large scale integration (VLSI) and ultra large scale integration (ULSI) circuits. Equally well known is that the patterns defining such interconnections are typically created by optical lithographic processes that require precise alignment with each circuit level of a semiconductor wafer to accurately interconnect the devices located in those levels.

Conventionally, alignment of the pattern on one layer to those of previous layers is done with the assistance of special alignment patterns, provided through alignment marks, designed onto each mask level. When these alignment marks are precisely aligned, the remainder of the circuit patterns are also correctly aligned. The adjustment of the image of the mask being exposed to the previously produced patterns was originally performed by human operators, who compared the image locations under a microscope and adjusted the position of the mask to bring it into alignment with the wafer patterns. Decreasing feature sizes and the increasing number of alignments per wafer, however, have promoted the development of automatic alignment systems for use with projection photolithographic machines commonly called "steppers".

Typical automatic alignment procedures involve the use of alignment marks formed in the same level of the semiconductor wafer where the active regions of each die are formed. In addition, such alignment marks are typically in the "kerfs" or "streets" that separate the individual dies formed on the semiconductor wafer. The streets form a grid-like pattern across a semiconductor wafer, dividing each of the dies formed therein. When manufacturing is completed, the dies are separated by cutting or sawing them apart, with the streets providing the guides for the blades.

In conventional alignment mark designs, the overall dimensions of the marks are generally large when compared to the dimensions of other areas on the wafer. Since the alignments marks are typically located in the streets, the larger the alignment marks are made, the larger the streets between the dies become. Those skilled in the art understand that as street size increases, the die yield of the semiconductor wafer decreases because of the increase in wafer surface area occupied by the streets. In view of the costs associated with wafer manufacturing, wafer manufacturers are eager to substantially reduce the size of the alignment marks in order to increase the number of dies obtained from each wafer.

Unfortunately, if the alignment marks are made too small in an effort to reduce street size, existing steppers have trouble detecting the marks, in some cases missing them altogether. More specifically, steppers are typically manufactured with the ability to detect a minimum alignment mark size. As a result, the overall size of the alignment marks may not be easily decreased by the wafer manufacturer, beyond this minimum size, without impacting the alignment mark detection of conventional the steppers. In addition, stepper manufacturers are typically unwilling to endure the expense of redesigning steppers capable of detecting alignment marks significantly smaller than those typically found on today's semiconductor wafers.

Accordingly, what is needed in the art is an integrated circuit die having alignment marks detectable by conventional steppers, and a method of manufacturing such alignment marks, that does not suffer from the deficiencies of the prior art.

SUMMARY OF THE INVENTION

To address the above-discussed deficiencies of the prior art, the present invention provides a die located on a semiconductor wafer. In one embodiment, the die includes a circuit region located within a circuit perimeter of the die. In addition, the die includes a bond pad region located between the circuit perimeter and an outer perimeter of the die. An alignment mark is located within the bond pad region.

In another aspect, the present invention provides a method of manufacturing a die located on a semiconductor wafer, which includes forming a circuit region located within a circuit perimeter of the die. The method further includes forming a bond pad region located between the circuit perimeter and an outer perimeter of the die, and creating an alignment mark located within the bond pad region.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the present invention.

BRIEF DESCRIPTION OF THE DRAWINGS

For a more complete understanding of the present invention, reference is now made to the following detailed description taken in conjunction with the accompanying FIGUREs. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 1:
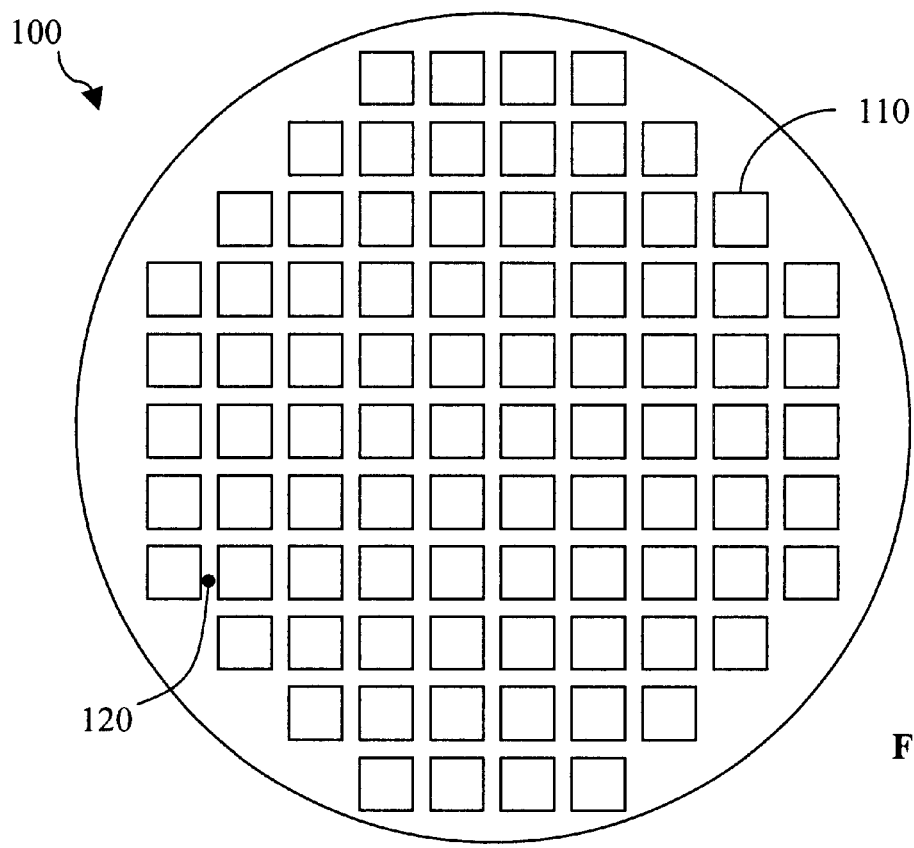
FIG. 1 illustrates one embodiment of a semiconductor wafer having individual integrated circuit dies formed thereon in accordance with the principles of the present invention.

Referring initially to FIG. 1, illustrated is one embodiment of a semiconductor wafer 100 having individual integrated circuit dies 110 formed thereon in accordance with the principles of the present invention. Also illustrated are kerfs 120 located between the individual dies 110. As is well known, the kerfs 120 are inactive areas of the semiconductor wafer 100. As many as several hundred integrated circuits dies 110 may be formed on a single semiconductor wafer 100, however, these numbers may vary with design technology or application.

Upon completion of the integrated circuits in the dies 110, a cutting tool, such as a diamond knife, is used to cut the individual dies 110 from the semiconductor wafer 100. The cut is conducted in the kerfs 120 of the semiconductor wafer 100, which destroys any alignment marks created in the kerfs 120. Thus, alignment marks are only necessary during the fabrication of the integrated circuit dies 110 and are destroyed in the process of separating the individual dies 110.

Figure 2:
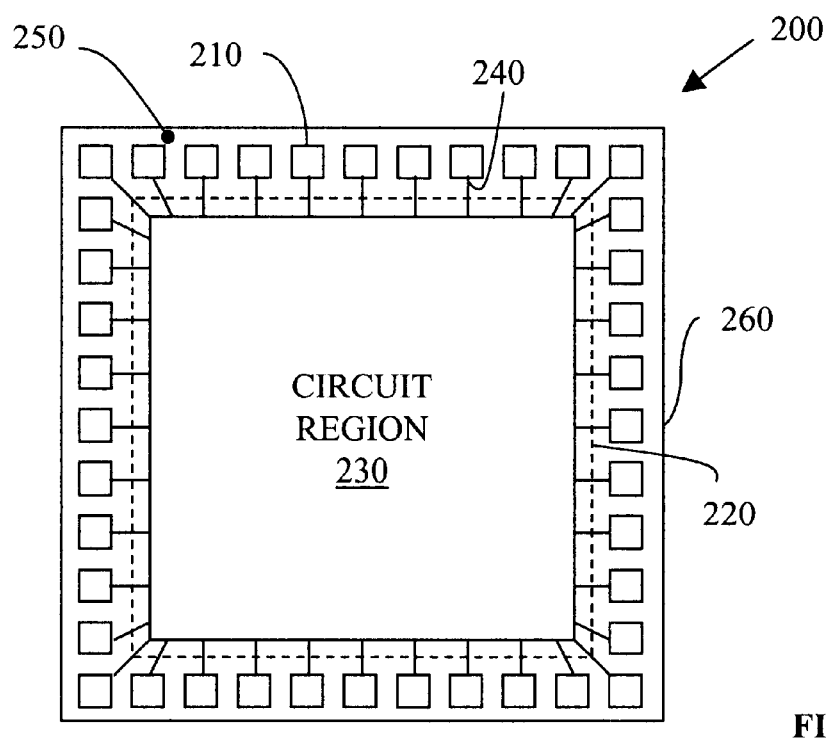
FIG. 2 illustrates one embodiment of an integrated circuit die manufactured according to the present invention.

Turning now to FIG. 2, illustrated is one embodiment of an integrated circuit die 200 manufactured according to the present invention. The die 200 includes multiple bond pads (one of which is designated 210) for interconnecting the die 200 with other components or circuits. As is well known in the art, the number of bond pads 210 on a die 200 may vary, depending on the number of input/outputs the die 200 includes. Of course, the present invention is not limited to any particular number, and may include, for example, as many as 2500 bond pads 210 for each die 200.

The die 200 also includes a circuit perimeter 220 surrounding a circuit region 230. As used herein, the term "circuit perimeter" means an outer boundary of a circuit region of an integrated circuit die. The term "circuit region" means the area of an integrated circuit die substantially having the active devices and electrical interconnects that form the integrated circuit, excluding, of course, input or output leads that extend beyond the circuit perimeter to connect the integrate circuit to external components. The input/outputs (not shown) in the circuit region 230 are electrically connected to the bond pads 210 using leads (one of which is designated 240). The bond pads 210 are, in turn, electrically coupled to other circuits or components so as to provide electrical communication between the circuit region 230 and external components.

In addition, the bond pads 210 are positioned in a bond pad region 250. As illustrated in FIG. 2, the bond pad region 250 is located between the circuit perimeter 220 and an outer edge 260 of the die 200. Also, the bond pad region 250 may extend through the entire die 200, on every layer found therein or only on a single layer at any level below a bond pad. Specifically, as used herein, the term "bond pad region" means the area of an integrated circuit die found outside the circuit perimeter 220 and beneath the area occupied by bond pads. Alignments marks (not illustrated) manufactured according to the principles described herein are located in the bond pad region 250, underneath the bond pads 210.

Figure 3:
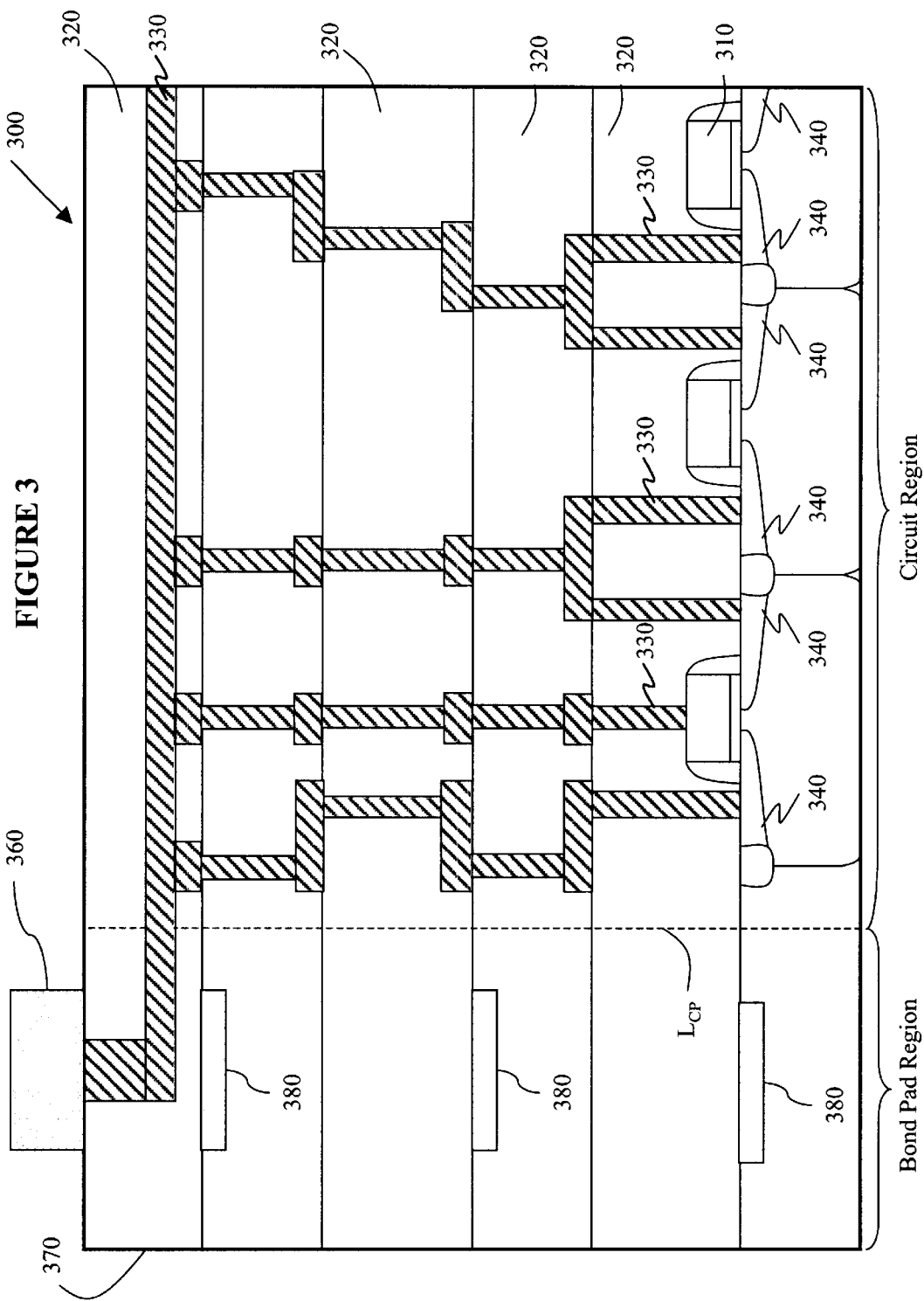
FIG. 3 illustrates a section view of one embodiment of a portion of an integrated circuit die manufactured according to the present invention.

Looking now at FIG. 3, illustrated is a section view of one embodiment of a portion of an integrated circuit die 300 manufactured according to the present invention. In general, the die 300 may include active devices, such as transistors, used to form CMOS devices, BiCMOS devices, Bipolar devices, or other types of active devices. The die 300 may further include passive devices, such as inductors or resistors, or it may also include optical devices or optoelectronic devices. Those skilled in the art are familiar with these various types of device and their manufacture.

In the embodiment illustrated in FIG. 3, components of the die 300 include conventionally formed transistors (one of which is designated 310) formed in a circuit region of the die 300. Such conventional transistors 310 may be metal-oxide semiconductor field effect transistors 310 (MOSFETs), however other types of transistors are within the scope of the present invention. Interlevel dielectric layers 320 are then shown deposited over the transistors 310. Although only three levels are shown in the embodiment in FIG. 3, those skilled in the art understand that a greater of fewer number of levels may be included in the die 300.

As illustrated, interconnect structures 330 are formed in the interlevel dielectric layers 320 to form interconnections between the various components in the die 300 to form an operative integrated circuit. Of course, these interconnect structures 330 may connect any number of components on one level to any number of components on another level. In addition, the interconnect structures 330 also provide an electrical connection between the components in the die 300 to a surface of the die 300 for providing an input/output connection. The interconnection of components within the die 300 to form an operative integrated circuit is well known to those skilled in the art, so that discussion will not be covered here. Also illustrated in the die 300 are conventionally formed tubs wherein source/drain regions 340 and isolation structures 350 are formed.

The die 300 also includes a bond pad region extending through the several layers of the die 300. As discussed above, the bond pad region is located beneath a bond pad 360, between an outer edge 370 of the die 300 and a circuit perimeter (illustrated by dashed line $L_{CP}$) In accordance with the principles of the present invention, alignment marks 380 are formed in the bond pad region for use in aligning each layer of the die 300 during its manufacture. In the illustrated embodiment, the alignment marks 380 are formed in a bond pad region that is free of circuitry. By forming the alignment marks 380 in an area free of circuitry, higher precision may be obtained during manufacturing.

In an exemplary embodiment of the present invention, the alignment marks 380 have a size that is less than or equal to a size of the bond pad 360. In advantageous embodiments, the size of the alignment marks 380 may range from about 40 microns by 40 microns to about 75 microns by 75 microns when the size of the bond pad 360 ranges from about 50 microns by 50 microns to about 110 microns by 110 microns, respectively. More specifically, the size of the alignments marks 380 may be about 40 microns by 40 microns, and the size of the bond pad 360 is about 50 microns by 50 microns when about 2500 bond pads 360 are manufactured on the die 300. However, in another embodiment, the size of the alignments marks 380 is about 75 microns by 75 microns, and the size of the bond pad 360 is about 110 microns by 110 microns when about 50 bond pads 360 are manufactured on the die 300. In a preferred embodiment, the size of the alignment marks is about 60 microns by 60 microns and the size of the bond pad 360 is about 75 microns by 75 microns. Of course, alignment marks and bond pads constructed according to the principles of the present invention may be any size or number, and the present invention is not intended to be limited to any particular sizes.

Of course, manufacture of the alignment marks 380 according to the principles of the present invention is not limited to the particular die 300 illustrated in FIG. 3. In fact, the present invention is broad enough to encompass the manufacture of any type of integrated circuit formed on a semiconductor wafer, which would benefit from alignment marks formed therein, as provided by the present invention. In addition, the present invention is broad enough to encompass integrated circuits having greater or fewer components than illustrated in the die 300 of FIG. 3.

By providing alignment marks in the bond pad region of an integrated circuit die, the present invention provides several benefits over the prior art. For instance, the present invention provides for the use of large alignment marks, without the need to increase the kerf size found on a semiconductor wafer. Since the alignment marks of the present invention are not positioned in the kerfs, kerf size can be reduced to the size of the blade used to sever the dies on the wafer. Those skilled in the art understand that as kerf size is reduced, the number of die yielded from a wafer is increased due to a decrease in the surface area of a wafer wasted by the kerfs. Moreover, as increases in technology provide for smaller and smaller cutting blades, the present invention continues to provide commensurate increases in die yield by allowing kerf size to be reduced.

In contrast to present trends, alignment marks manufactured according to the present invention may also be made relatively large without resulting in deleterious effects. More specifically, prior art alignment marks formed in the kerfs, which are typically made relatively large for conventional steppers to read, increase kerf size, thus decreasing die yield. However, alignment marks of the present invention may be made large enough for such steppers to easily read while still allowing kerf size to be reduced. Thus, in addition to the advantages of decreased kerf size, the present invention allows the semiconductor manufacturer to increase die yield, as discussed above, without relying on the stepper manufacturers to provide steppers capable of reading substantially smaller alignment marks. Therefore, each time alignment marks according to the present invention are employed in integrated circuit die manufacturing, overall manufacturing costs may be eliminated from the entire manufacturing process due to the increase in die yield achieved by the principles of the present invention.

Although the present invention has been described in detail, those skilled in the art should understand that they can make various changes, substitutions and alterations herein without departing from the spirit and scope of the invention in its broadest form.

What is claimed is:

1. A die located on a semiconductor wafer, comprising:
    a circuit region located within a circuit perimeter of said die, wherein said die includes multiple layers;
    a bond pad region located between said circuit perimeter and an outer perimeter of said die; and
    an alignment mark located within said bond pad region and on at least one of said multiple layers.

2. The die as recited in claim 1 wherein said die includes at least one bond pad located on an outermost level of said die and within said bond pad region and over said alignment mark.

3. The die as recited in claim 2 wherein a size of said alignment mark is less than or equal to a size of said at least one bond pad.

4. The die as recited in claim 3 wherein said size of said alignment mark ranges from about 40 microns by 40 microns to about 75 microns by 75 microns when said size of said at least one bond pad ranges from about 50 microns by 50 microns to about 110 microns by 110 microns.

5. The die as recited in claim 1 further including a bond pad located in said bond pad region, said bond pad electrically connected to a circuit located within said circuit region.

6. A method of manufacturing a die located on a semiconductor wafer, comprising:
    forming a circuit region located within a circuit perimeter of said die;
    forming a bond pad region located between said circuit perimeter and an outer perimeter of said die; and
    creating an alignment mark located within said bond pad region.

7. The method as recited in claim 1 wherein forming a circuit region includes forming multiple layers and creating an alignment mark includes creating an alignment on at least one of said multiple layers.

8. The method as recited in claim 1 further including forming at least one bond pad located on an outermost level of said die and within said bond pad region and over said alignment mark.

9. The method as recited in claim 8 wherein creating an alignment mark includes creating an alignment mark having a size less than or equal to a size of said at least one bond pad.

10. The method as recited in claim 9 wherein said size of said alignment mark ranges from about 40 microns by 40 microns to about 75 microns by 75 microns when said size of said at least one bond pad ranges from about 50 microns by 50 microns to about 110 microns by 110 microns.

11. The method as recited in claim 9 wherein said size of said alignment mark is about 60 microns by 60 microns and said size of said at least one bond pad is about 75 microns by 75 microns.

12. The method as recited in claim 6 further including forming a bond pad within said bond pad region and electrically connecting said bond pad to a circuit located within said circuit region.

13. The method as recited in claim 6 further including forming transistors on a transistor level of said circuit region.

14. The method as recited in claim 13 wherein creating an alignment mark includes creating an alignment mark at said transistor level.

15. A semiconductor wafer, comprising:
    a plurality of integrated circuit dies having multiple layers located on said semiconductor wafer wherein each of said integrated circuit dies includes:
        circuits located within a circuit region located within a circuit perimeter of each of said dies;
        bond pads located within a bond pad region located between said circuit perimeter and an outer perimeter of each of said dies; and
        alignment marks located within said bond pad region of each of said dies and on at least one of said multiple layers.

16. The semiconductor wafer as recited in claim 15 wherein a size of each of said alignment marks is less than or equal to a size of each of said bond pads.

17. The semiconductor wafer as recited in claim 16 wherein said size of each of said alignment marks ranges from about 40 microns by 40 microns to about 75 microns by 75 microns when said size of each of said bond pad ranges from about 50 microns by 50 microns to about 110 microns by 110 microns.

18. The semiconductor wafer as recited in claim 15 wherein said circuits include transistors located on a transistor level of each of said integrated circuit dies.

* * * * *